United States Patent
Tsujino

(10) Patent No.: US 8,344,259 B2
(45) Date of Patent: Jan. 1, 2013

(54) CONNECTION TERMINAL, PACKAGE USING THE SAME, AND ELECTRONIC APPARATUS

(75) Inventor: Mahiro Tsujino, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 403 days.

(21) Appl. No.: 12/739,937

(22) PCT Filed: Oct. 30, 2008

(86) PCT No.: PCT/JP2008/069749
§ 371 (c)(1),
(2), (4) Date: Apr. 26, 2010

(87) PCT Pub. No.: WO2009/057691
PCT Pub. Date: May 7, 2009

(65) Prior Publication Data
US 2010/0252313 A1  Oct. 7, 2010

(30) Foreign Application Priority Data

Oct. 30, 2007 (JP) .................................. 2007-281069
Nov. 29, 2007 (JP) .................................. 2007-308272

(51) Int. Cl.
*H05K 1/03* (2006.01)
(52) U.S. Cl. .......................... 174/255; 174/260; 174/262
(58) Field of Classification Search .................... None
See application file for complete search history.

(56) References Cited

U.S. PATENT DOCUMENTS

| | | | | |
|---|---|---|---|---|
| 6,936,921 | B2 * | 8/2005 | Yoshida | 257/728 |
| 2007/0273008 | A1 * | 11/2007 | Suzuki | 257/659 |
| 2009/0101396 | A1 * | 4/2009 | Mizuno et al. | 174/260 |

FOREIGN PATENT DOCUMENTS

| JP | 2004-356391 | 12/2004 |
|---|---|---|
| JP | 2005-108891 | 4/2005 |

* cited by examiner

*Primary Examiner* — Ishwarbhai Patel
(74) *Attorney, Agent, or Firm* — DLA Piper LLP (US)

(57) ABSTRACT

A connection terminal has, on an upper surface of a first dielectric layer, a first line conductor and a first grounding line conductor provided adjacent to both sides of the first line conductor, and has, on an upper surface of a third dielectric layer, a third line conductor and a third grounding line conductor provided adjacent to both sides of the third line conductor. These conductors are connected to a second line conductor and a second grounding line conductor provided adjacent to both sides of the second line conductor, respectively, the second line conductor and the second grounding line conductor being provided on an upper surface of a second dielectric layer. It is possible to obtain the connection terminal having a small size and capable of complying with a high-frequency signal.

10 Claims, 7 Drawing Sheets

FIG. 1
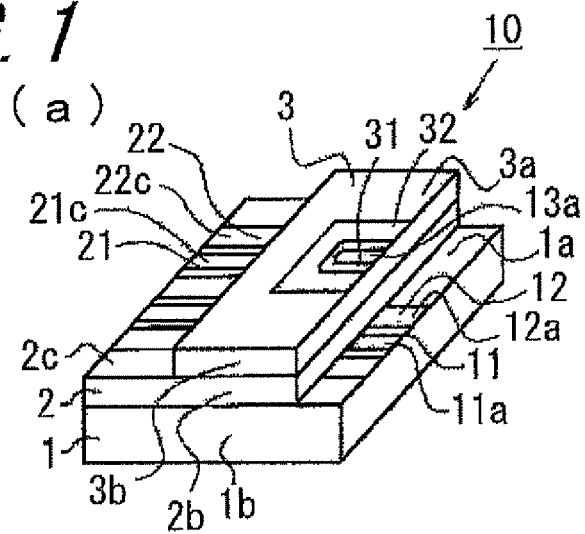
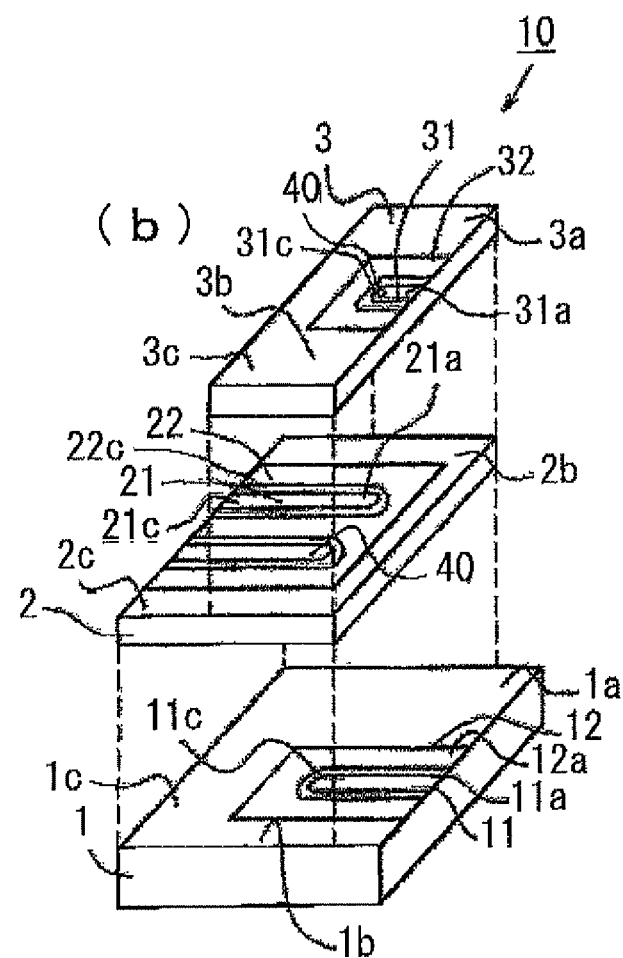

FIG. 3
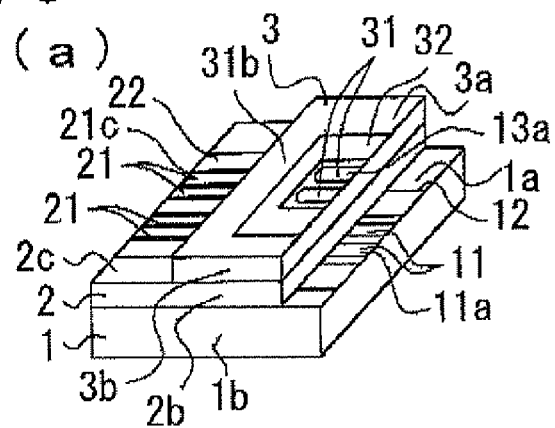
(a)
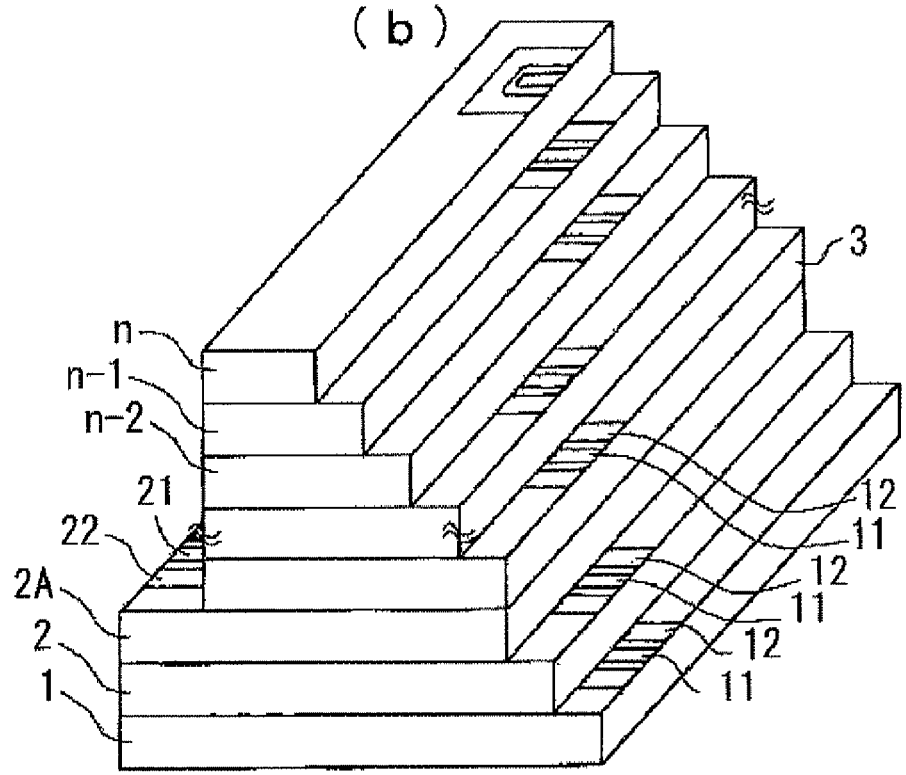
(b)

FIG. 4
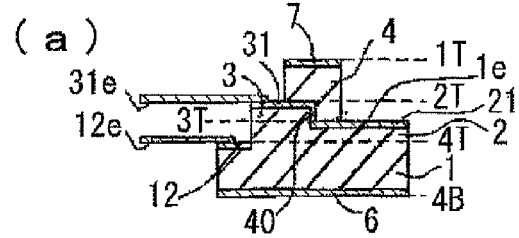
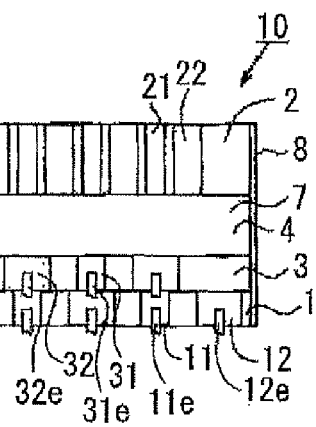
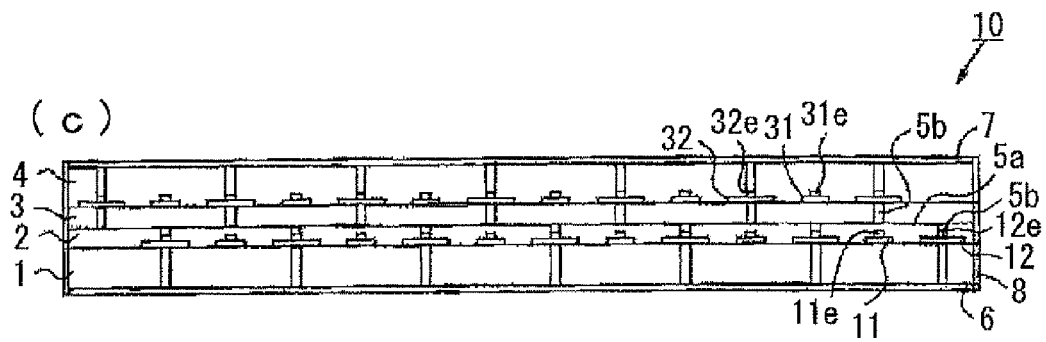

FIG. 5
(a) 
(b) 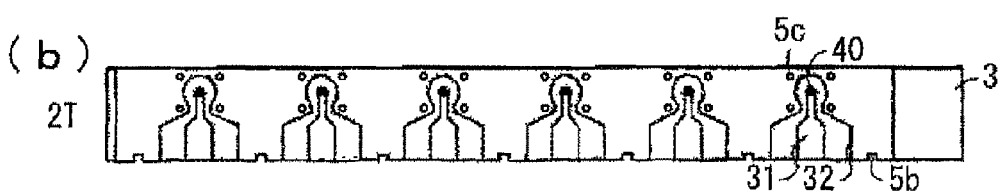
(c) 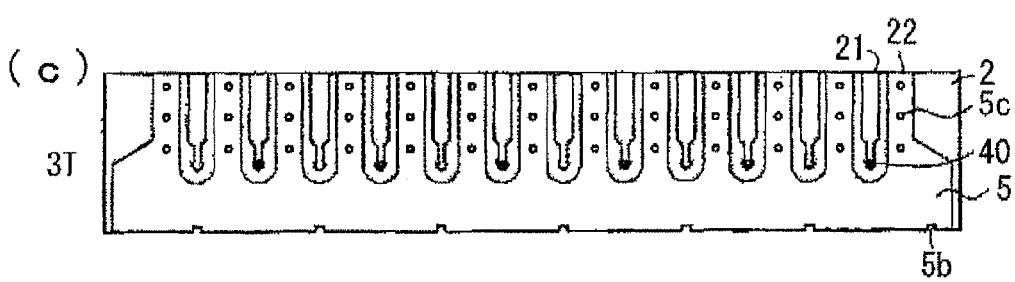
(d) 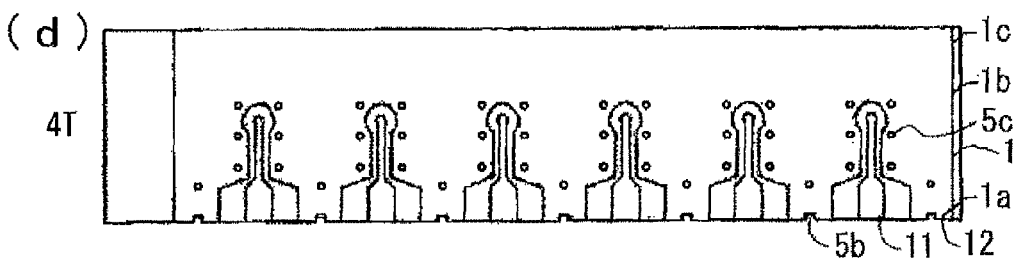
(e) 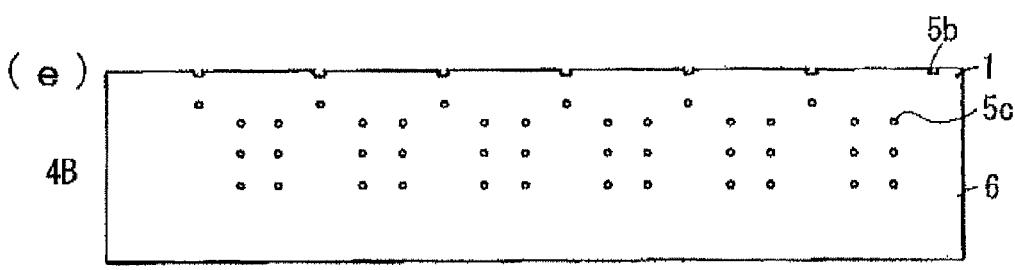

FIG. 6
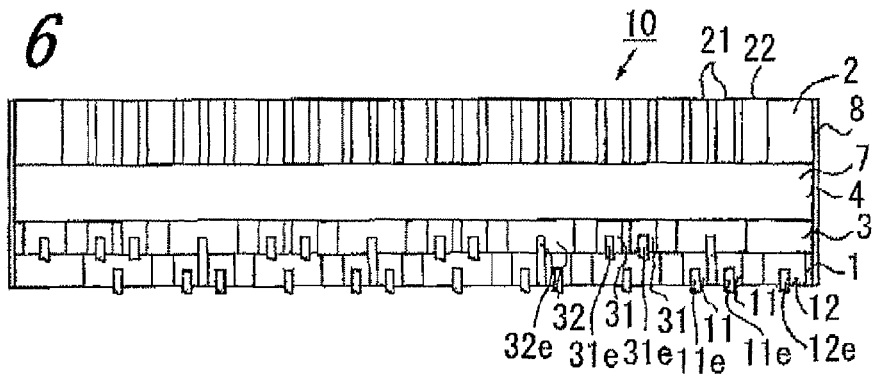
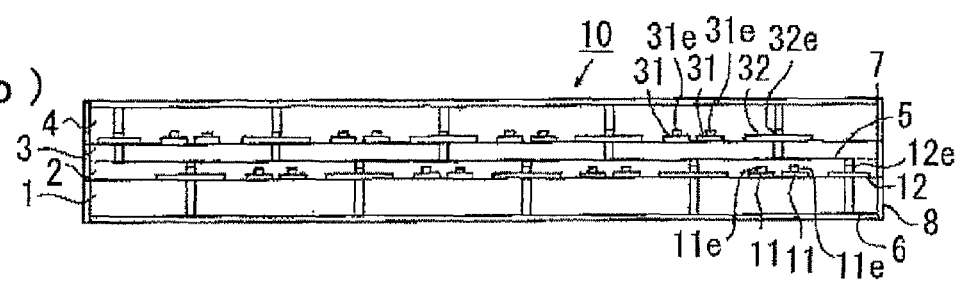
FIG. 7
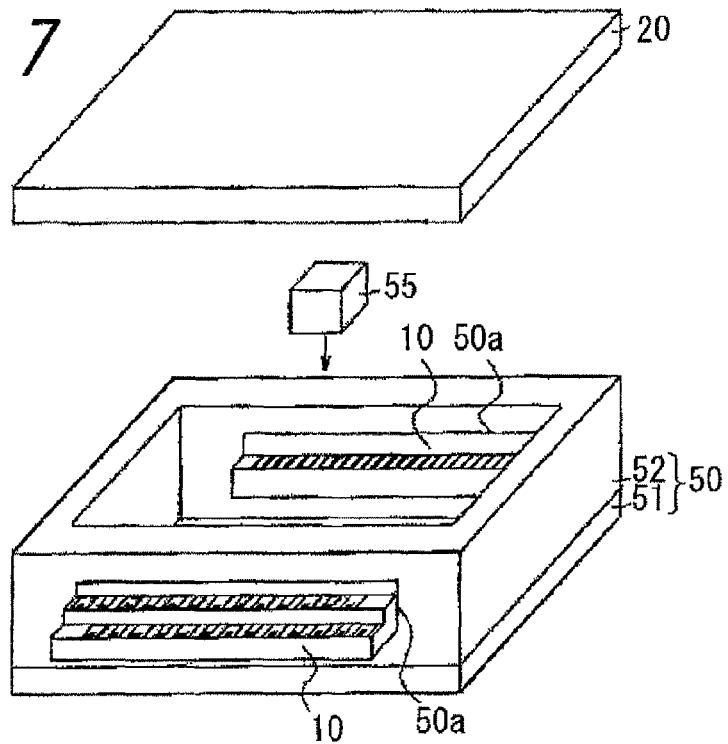

FIG. 8 PRIOR ART
(a)
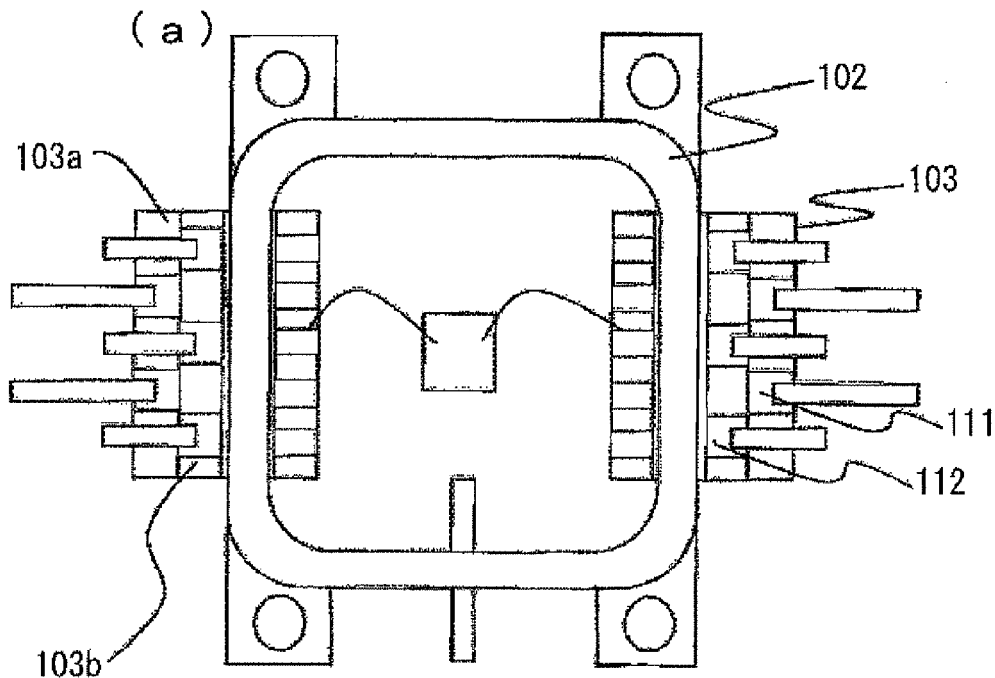
PRIOR ART
(b)
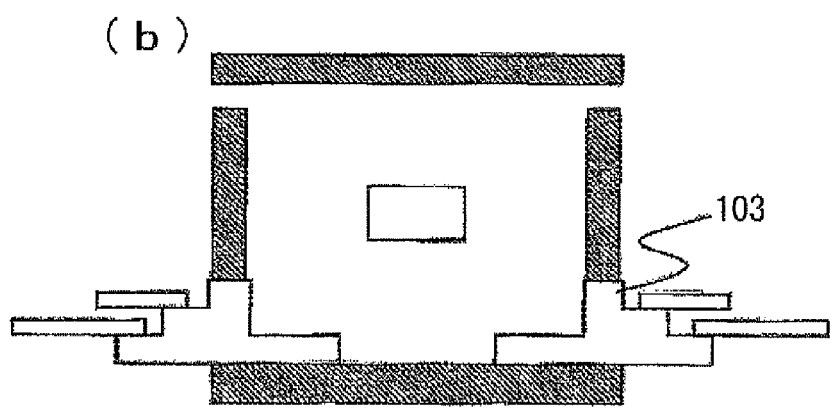

CONNECTION TERMINAL, PACKAGE USING THE SAME, AND ELECTRONIC APPARATUS

CROSS-REFERENCE TO THE RELATED APPLICATIONS

This application is a national stage of international application No. PCT/JP2008/069749, filed on Oct. 30, 2008 and claims the benefit of priority under 35 USC 119 to Japanese Patent Application No. 2007-281069 filed on Oct. 30, 2007 and Japanese Patent Application No. 2007-308272 filed on Nov. 29, 2007, the entire contents of which are incorporated herein by reference.

TECHNICAL FIELD

The present invention relates to a connection terminal that allows wiring with high density, and to a package for housing a high-frequency semiconductor device or an electronic circuit incorporating such a high-frequency semiconductor device using the same, as well as an electronic apparatus, which employs the connection terminal.

BACKGROUND ART

In keeping with the recent increase of the amount of information to be processed in information telecommunication equipment, electronic circuits for signal transmission have come to be adapted to increasingly higher frequency level with a growing number of wiring connections. The trend in the design of a package for housing electronic components is also toward adaptability to high frequency ranges and an increase in the number of terminals for providing connection between inside and outside of the package. FIG. 8 shows an example of an electronic apparatus constructed by placing an electronic component within a package in a hermetic manner. Specifically, FIG. 8(a) is a plan view of the package and FIG. 8(b) is a structural diagram showing a cross section of the package.

In the package shown in FIG. 8, an input-output terminal 103 comprises a ceramic-made first flat-plate portion 103a formed with a first line conductor 111 extending between an outer one side of a topside frame 102 and an inner other side of the frame 102; and a ceramic-made second flat-plate portion 103b formed with a second line conductor 112 which extends in parallel with the first line conductor 111 so as to avoid overlap with the first line conductor 111 in a vertical direction (for example, refer to (Japanese Unexamined Patent Publication JP-A 2004-356391).

In this way, by arranging the first line conductor 111 and the second line conductor 112 in an alternating manner so as to avoid mutual overlap in the vertical direction, even if the number of the line conductors 111 and 112 is increased, it never occurs that the input-output terminal 103 has an unduly large size.

However, in recent years, electronic components have come to be operated with electric signals in increasingly higher frequency ranges. Should electric signals in high frequency ranges be transmitted through the first line conductor 111 and the second line conductor 112, there will arise the problem that the input-output terminal of conventional design and the package using it fail to serve the intended purposes.

DISCLOSURE OF INVENTION

The invention has been devised in view of the problem described hereinabove, and accordingly its object is to provide a connection terminal that allows wiring with high density and is adaptable even to high frequency level, as well as a package using the same and an electronic apparatus that employ the connection terminal.

In order to solve the above-described problem, a connection terminal in accordance with one embodiment of the invention is designed in the form of a multilayer body having a first end portion and a second end portion, in which first to third dielectric layers are stacked one on top of another. The multilayer body comprises a first line conductor which is disposed so as to extend from a central portion of the first dielectric layer to the first end portion and is exposed at the first end portion; a first grounding line conductor which is disposed adjacent to both sides of the first line conductor and is exposed at the first end portion; two pieces of second line conductors, each of which is disposed so as to extend from a central portion of the second dielectric layer to the second end portion and is exposed at the second end portion; a second grounding line conductor which is disposed adjacent to both sides of each of the second line conductors and is exposed at the second end portion; a third line conductor which is disposed so as to extend from a central portion of the third dielectric layer to the first end portion and is exposed at the first end portion; and a third grounding line conductor which is disposed adjacent to both sides of the third line conductor and is exposed at the first end portion. In addition, in the central portions of the multilayer body are provided connecting conductors that connects the first line conductor to one of the second line conductors and connects the third line conductor to the other of the second line conductors, respectively.

A package in accordance with one embodiment of the invention comprises a base body having a cavity, and any of the connection terminals as set forth herein which is attached to a wall portion of the base body and establishes a conducting state between inside and outside of the cavity.

An electronic apparatus in accordance with one embodiment of the invention comprises an electronic device mounted within the cavity and a lid body for sealing the cavity.

In the connection terminal in accordance with one embodiment of the invention, the first grounding line conductor is disposed adjacent to both sides of the first line conductor, the second grounding line conductor is disposed adjacent to both sides of the second line conductor, the third grounding line conductor is disposed adjacent to both sides of the third line conductor, and those line conductors are electrically connected to each other by the connecting conductors, whereby even signals in high-frequency ranges, or high-frequency signals can be conducted satisfactorily. Moreover, since the first line conductor and the third line conductor are placed in the first dielectric layer and the third dielectric layer, in a vertical direction, it follows that the connection terminal is adaptable to wiring with high density.

In the package in accordance with one embodiment of the invention, any of the connection terminals as set forth herein is attached to the wall portion of the base body having a cavity for establishing a conducting state between inside and outside of the cavity. In this construction, high-frequency signal conduction can be effected between inside and outside of the cavity by the line conductors installed highly densely. Accordingly, it is possible to provide a compact package that allows installation of a large number of terminals with adaptability to high-frequency level.

In the electronic apparatus in accordance with one embodiment of the invention, there are provided the electronic device mounted within the cavity and the lid body for sealing the cavity. Accordingly, it is possible to provide a compact high-frequency electronic apparatus.

BRIEF DESCRIPTION OF DRAWINGS

FIG. 1 is a diagram showing a connection terminal in accordance with one embodiment of the invention, and FIG. 1(a) is a perspective view of the connection terminal and FIG. 1(b) is an exploded perspective view of the connection terminal;

FIGS. 3(a) and 3(b) are a perspective view showing the connection terminal in accordance with one embodiment of the invention, respectively;

FIG. 4 is a diagram showing the connection terminal in accordance with one embodiment of the invention, and FIG. 4(a) is a sectional view of the connection terminal, FIG. 4(b) is a plan view of the connection terminal, and FIG. 4(c) is a front view of the connection terminal;

FIGS. 5(a) through 5(e) are plan views each showing a conductor pattern of each dielectric layer of the connection terminal shown in FIG. 4.

FIG. 6 is a diagram showing the connection terminal in accordance with one embodiment of the invention, and FIG. 6(a) is a plan view of an example in which line conductors and ground conductors are arranged in the order presented: G (ground), S (signal), S (signal), and G (ground), and FIG. 6(b) is a front view of the connection terminal shown in FIG. 6(a).

FIG. 7 is a schematic perspective view showing a package and an electronic apparatus in accordance with one embodiment of the invention; and FIG. 8 is a diagram showing an example of a conventional input-output terminal, and FIG. 8(a) is a plan view of a package and FIG. 8(b) is a structural diagram showing a cross section of the package.

BEST MODE FOR CARRYING OUT THE INVENTION

Figure 2:
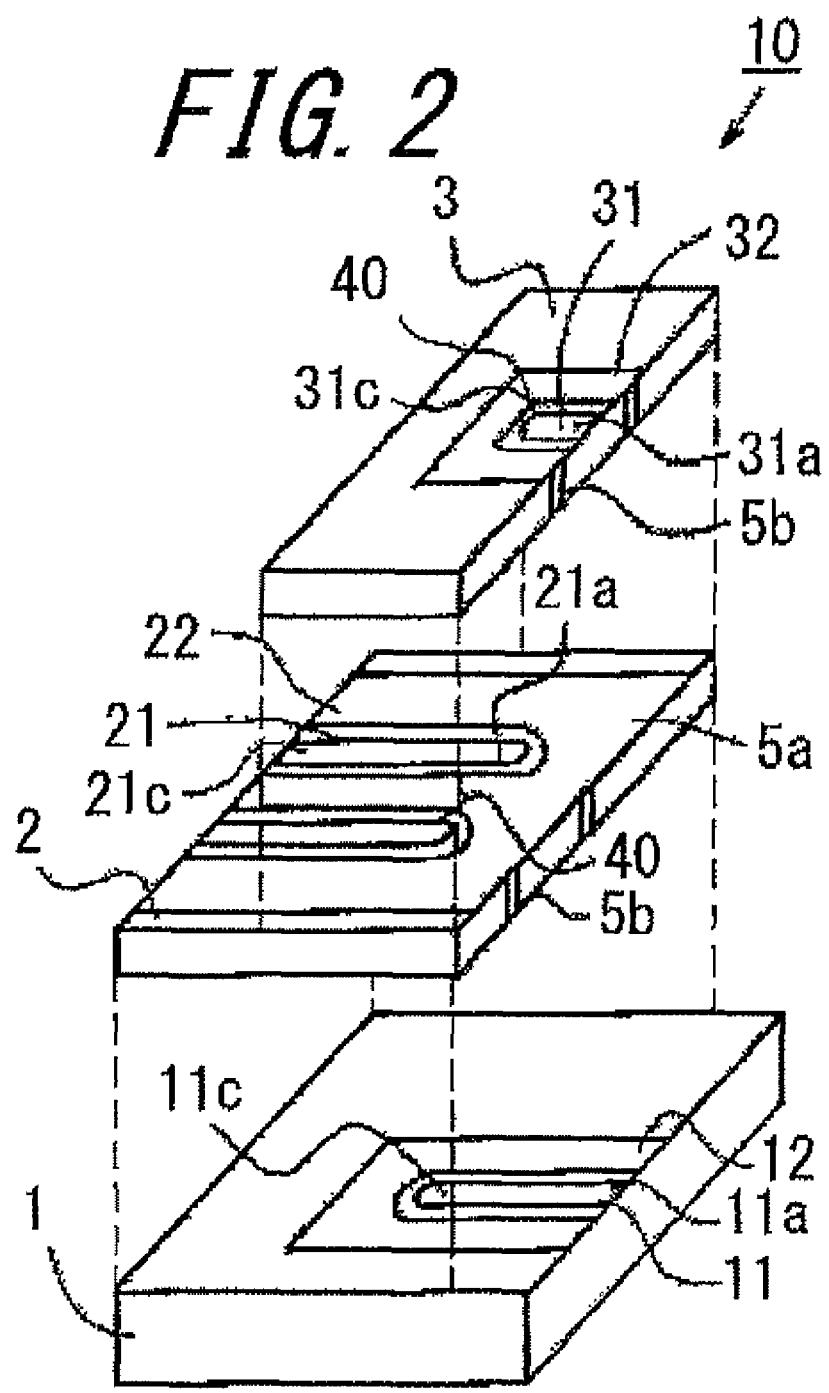
FIG. 2 is an exploded perspective view of the connection terminal in accordance with one embodiment of the invention.

Now, a detailed description will be given below as to a connection terminal 10, a package using the same and an electronic apparatus in accordance with one embodiment of the invention.

In the connection terminal 10, on the upper surface of a first dielectric layer 1 provided as a flat-plate portion are stacked a second dielectric layer and a third dielectric layer one after another. Disposed on the upper surface of the first dielectric layer 1 is a first line conductor 11 formed so as to extend from a central portion 1b to a first end portion 1a (hereafter also referred to as "one end 1a") for transmission of electric signals of a predetermined frequency. The first line conductor 11 is exposed at the first end portion 1a. On both sides of the first line conductor 11, there is disposed a first grounding line conductor adjacent thereto that is electrically connected to an external ground circuit. The first grounding line conductor is exposed at the first end portion 1a. In other words, the second dielectric layer 2 is stacked on the upper surface of the first dielectric layer 1 in such a way that one end portion 11a of the first line conductor 11 and one end portion 12a of the first grounding line conductor 12 can be exposed to the outside. On the second dielectric layer 2, two pieces of second line conductors 21 are arranged so as to extend from a central portion 2b to a second end portion 2c (hereafter also referred to as "the other end 2c") thereof. The second line conductor 21 is exposed at the second end portion 2c. On both sides of each of the second line conductors 21, there is disposed a second grounding line conductor 22 adjacent thereto that is exposed at the second end portion. In other words, the third dielectric layer 3 is bonded to the upper surface of the second dielectric layer 2, except for the area bearing the other end portion 21c of the second line conductor 21 and the other end portion 22c of the second grounding line conductor 22. In this way, the other end portions 21c and 22c can be exposed to the outside. On the third dielectric layer 3, a third line conductor 31 is disposed so as to extend from a central portion 3b to one end 3a thereof for transmission of electric signals of a predetermined frequency. The third line conductor 31 is exposed at one end 3a. On both sides of the third line conductor 31, there is disposed a third grounding line conductor 32 adjacent thereto that is exposed at one end 3a. The other end 11c of the first line conductor 11 and one end 21a of one of the two second line conductors 21 are connected to each other by a connecting conductor 40. Moreover, the other end 31c of the third line conductor 31 and one end 21a of the other of the two second line conductors are connected to each other by a connecting conductor 40.

Note that a fourth dielectric layer 4 may additionally be disposed on the upper surface of the third dielectric layer 3 in such a way that one end 31a portion of the third line conductor 31 and one end 32a portion of the third grounding line conductor 32 can be exposed to the outside. In this case, even if a metal conductor or the like is disposed on the top side of the connection terminal 10, it is possible to achieve insulation of the third grounding line conductor 32 and the third line conductor 31. Moreover, with the provision of the fourth dielectric layer 4, it is possible to achieve hermetic isolation between one end side 1a and the other end side 1c of the connection terminal 10, and thereby render the connection terminal 1 suitable for use in a package which is required to offer internal hermeticity. Further, by disposing a downside ground conductor 6 on the lower surface of the first dielectric layer 1 and disposing a topside ground conductor 7 on the upper surface of the fourth dielectric layer 4, the first to third line conductors 11, 21, and 31 can be shielded from external noise, and also the connection terminal 10 can be bonded to metal or the like by means of brazing.

As shown in FIG. 1, in the connection terminal 10, on both sides of the first line conductor 11, the first grounding line conductor 12 is disposed in parallel to the first line conductor 11 with a predetermined spacing secured therebetween. Moreover, on both sides of the second line conductor 21, the second grounding line conductor 22 is disposed in parallel to the second line conductor 21 with a predetermined spacing secured therebetween. Further, on both sides of the third line conductor 31, the third grounding line conductor 32 is disposed in parallel to the third line conductor 31 with a predetermined spacing secured therebetween. Thus, the first line conductor 11 and the first grounding line conductor 12, the second line conductor 21 and the second grounding line conductor 22, and the third line conductor 31 and the third grounding line conductor 32 constitute a so-called coplanar line structure of G (ground)-S (signal)-G (ground) arrangement pattern. By virtue of the G-S-G coplanar line structure, even electric signals in high-frequency ranges, or high-frequency electric signals can be transmitted satisfactorily through the first line conductor 11, the second line conductor 21, and the third line conductor 31.

With the alternate arrangement of a plurality of the first line conductors 11 and the first grounding line conductors 12 on the upper surface of the first dielectric layer 1, the first grounding line conductor 12 is disposed on both sides of a single first line conductor 11, thereby constituting a coplanar line structure. Likewise, the third line conductor 31 and the third grounding line conductor 32 constitute a coplanar line structure.

The second line conductors 21 are arranged side by side on the upper surface of the second dielectric layer 2. One of the second line conductors 21 is connected to the first line conductor 11, at the other end 11b thereof, via the connecting conductor 40. Moreover, another second line conductor 21 next to the aforementioned second line conductor is connected to the third line conductor 31 via the connecting conductor 40. Between the second line conductors 21 is located the second grounding line conductor 22. In this way, the second line conductors 21 and the second grounding line conductors 22 are arranged in an alternating manner.

One of the two adjacent second line conductors 21 is connected via the connecting conductor 40 to the lower first line conductor 11, whereas the other second line conductor 21 is connected via the connecting conductor 40 to the upper third line conductor 31. That is, the second line conductors 21 are positioned between the first line conductor 11 and the third line conductor 31. Since the first line conductor 11 and the third line conductor 31 are arranged in a symmetrical manner with respect to the second line conductor 21, it is easy to strike a balance in impedance between the second line conductor 21 connected to the first line conductor 11 and the second line conductor 21 connected to the third line conductor 31.

Moreover, while the first line conductor 11 and the third line conductor 31 are separately arranged below and above the second line conductor 21 in the vertical direction, the second line conductors 21 are arranged side by side on the same plane. This helps facilitate the operation of connecting the second line conductor 21 with an electronic component 55 and so forth.

By adjusting the line width of the second line conductor 21 to be narrower than the line widths of, respectively, the first line conductor 11 and the third line conductor 31, it is possible to reduce the distance between the adjacent first line conductors 11 and the distance between the adjacent third line conductors 31, and thereby facilitate wiring with high density. Moreover, a decrease in the line width of the second line conductor 21 allows the shortening of a predetermined distance between the second line conductor 21 and the second grounding line conductor 22, and thus affords an advantage in terms of wiring with high density.

In a case where the third grounding line conductor 32 is placed above the first grounding line conductor 12, by forming, on a side face of the second dielectric layer 2 which is close to one end 2a and a side face of the third dielectric layer 3 which is close to one end 3a, a castellation conductor 5b Which will hereinafter be described so as to extend from the first grounding line conductors 12 to the third grounding line conductor 32, it is possible to connect the first grounding line conductor 12, as well as the third grounding line conductor 32, at ground potential (reference potential) and thereby bring the ground potential into a condition of stability.

Preferably, the third grounding line conductor 32 is placed above the first line conductor 11. In this case, since the third grounding line conductor 32 with the ground potential is placed above the first line conductor 11, it is possible to bring the high-frequency characteristics of the first line conductor 11 into a condition of stability. Moreover, in this case, in contrast to the case of placing the third line conductor 31 above the first line conductor 11, it is possible to secure a sufficient spacing between the first line conductor 11 and the third line conductor 31, and thereby reduce interference between the first line conductor 11 and the third line conductor 31.

FIG. 2 is a diagram showing the connection terminal 10 in accordance with one embodiment of the invention. In this construction, a ground layer 5a is formed within a dielectric layer formed of the second dielectric layer and the third dielectric layer which lie between the first line conductor 31 and the third line conductor 31. As shown in FIG. 2, it is preferable that the castellation conductor 5b is formed in the region between the ground layer 5a and the first grounding line conductor 12 as well as the third grounding line conductor 31, so that the first grounding line conductor 12 and the third grounding line conductor 32 are electrically connected to each other.

In this way, with the provision of the ground layer 5a, a ground potential acting as a reference potential can be provided between the first grounding line conductor 12 and the third grounding line conductor 32. Moreover, an external noise component that finds its way into the connection terminal 1 can be shielded by the ground layer 5a.

As shown in FIG. 2, the third grounding line conductor 32 is positioned above the first line conductor 11, and the first grounding line conductor 12 is positioned below the third line conductor 31. Moreover, since the castellation conductor 5b is so placed as to extend from the third grounding line conductor 32 toward the top of the first line conductor 11, it is possible to bring the ground potential at the top of the first line conductor 11 into a condition of stability, and thereby allow efficient transmission of high-frequency signals through the first line conductor 11. Further, since the castellation conductor 5b is so placed as to extend from the first grounding line conductor 12 toward the bottom of the third line conductor 31, it is possible to bring the ground potential at the bottom of the third line conductor 31 into a condition of stability, and thereby allow efficient transmission of high-frequency signals through the third line conductor 31. In addition, the distance between the first line conductor 11 and the third line conductor 31 can be increased, with the consequence that a high-frequency signal propagating through the first line conductor 11 and a high-frequency signal propagating through the third line conductor 31 are less likely to interfere with each other.

FIG. 3(a) is a perspective view showing the connection terminal 10 in accordance with another embodiment of the invention. In this constructive example, the first line conductor 11, the second line conductor 21, and the third line conductor 31 are each divided into two portions and constitute, in conjunction with the grounding line conductors 12, 22, and 32 located on both sides thereof, respectively, a line structure of G-S-S-G arrangement pattern.

Moreover, a pair of the two first line conductor 11 portions, a pair of the two second line conductor 21 portions, and a pair of the two third line conductor 31 portions are each capable of acting as a differential line. With the differential line function, electric signals propagating through the paired two line conductors can be transmitted in combination, with the consequence that the electric signals propagating through the line conductors 11, 21, and 31 are less likely to incur a transmission loss such as a permeation loss. Accordingly, the line conductors 11, 21, and 31 allow high-frequency electric signals to propagate therethrough satisfactorily.

Note that, in FIG. 3(a), the first line conductor 11, the second line conductor 12, and the third line conductor 31 are each illustrated as being designed as a differential line. Alternatively, it is, also possible to render only one of the first line conductor 11 and the third line conductor 31, and the second line conductor 21 connected thereto a differential line, as well as to render only some of a plurality of the first line conductors 11 or the third line conductors 31 a differential line.

FIG. 3(b) is a perspective view showing an embodiment of the connection terminal 10 shown in FIG. 1 having an increased number of constituent layers. While the above description deals with the case of providing the first to third dielectric layers 1 to 3, the connection terminal may be designed to have n pieces of dielectric layers. In this construction, on each of surfaces of the first to n-th dielectric layers 1 to n, just like the first line conductor 11 or the third line conductor 31 as described previously, the first line conductor 11 is disposed, and the first grounding line conductor 12 is disposed adjacent to both sides of the first line conductor 11. Moreover, on the other end side of an intermediate layer 2A located between the dielectric layer 1 and the dielectric layer n, there are arranged n pieces of the second line conductors 21 and the second grounding line conductors 22. The corresponding ones of those line conductors are connected to each other by the connecting conductor 40.

A dielectric material such as ceramics is used for the first to fourth dielectric layers 1 to 4. Then, by adopting a heretofore known ceramic green sheet lamination technique, it is possible to produce the connection terminal 10 with high dimensional accuracy.

For example, as shown in FIGS. 5(a) through 5(e), on the upper surface of the first dielectric layer 1 having a rectangular parallelepiped shape, the first line conductor 11 and the first grounding line conductor 12 are formed. The first line conductor 11 is formed by printing a metallization layer of tungsten (W), molybdenum (Mo), manganese (Mn), or the like material so as to extend from a longer edge close to one end 1a to the central portion 1b of the first dielectric layer 1, through which electric signals of a predetermined frequency are transmitted. In addition, the first grounding line conductor 12 is disposed adjacent to the first line conductor 11 and electrically connected with an external ground circuit. Note that, as shown in FIG. 5(d), it is preferable that the first grounding line conductor 12 is applied in sheet-like form so as to extend to a longer edge close to the other end 1c of the first dielectric layer 1 and to surround the first line conductor 11.

Moreover, as shown in FIG. 5(c), also on the upper, surface of the second dielectric layer 2 prepared separately, the second line conductor 21 and the pattern of a metallization paste to be the second grounding line conductor 22 are formed. The second line conductor 21 is formed by a metallization layer of W, Mo, Mn, or the like material, through which electric signals of a predetermined frequency are transmitted. The pattern of the metallization paste to be the second grounding line conductor 22 which is disposed adjacent to the second line conductor 21 and electrically connected with an external ground circuit is formed by using. Likewise, as shown in FIG. 5(b), on the upper surface of the third dielectric layer 3, the third line conductor 31 and the third grounding line conductor 32 are formed.

For example, the first line conductor 11, the second line conductor 21, the third line conductor 31, the first grounding line conductor 12, the second grounding line conductor 22, and the third grounding line conductor 32 are formed by print-coating a metal paste, which is obtained by admixing an organic solvent medium and a solvent in W, Mo, Mn, or the like material in powdery form, to the upper surfaces of ceramic green molded products serving as the first to fourth dielectric layers 1 to 4, respectively, in predetermined patterns by a heretofore known screen printing technique.

Note that FIG. 5(a) shows the fourth dielectric layer 4 in a case where the fourth dielectric layer 4 is stacked on the upper surface of the third dielectric layer 3. The fourth dielectric layer 4 has its upper surface wholly coated with a metallization paste.

Moreover, FIG. 5(e) shows the lower surface of the first dielectric layer 1. The first dielectric layer 1 has its lower surface wholly coated with a metallization paste.

Those dielectric layers are stacked one on top of another, are bonded together, and are fired thereby to form the connection terminal 10. FIG. 4 shows the connection terminal 10 thereby constructed. In FIG. 4, FIG. 4(a) shows a sectional view thereof, FIG. 4(b) shows a plan view thereof, and FIG. 4(c) shows a front view thereof.

By making changes to the thicknesses of the second dielectric layer 2 and the third dielectric layer 3, it is possible to vary the length of the connecting conductor 40 acting as the connection between the second line conductor 21 and the first line conductor 11 or the third line conductor 31. For example, adjustment can be performed in such a way as to match the electrical length from one end 11a of the first line conductor 11 to the second line conductor 21 to the electrical length from one end 31a of the third line conductor 31 to the second line conductor 21. As employed herein, the "electrical length" refers to a length based on a single wavelength of a high-frequency electric signal on the line conductors 11 and 31 as a unit.

In order to form the castellation conductor 5b, a groove-like castellation (notch) is formed in advance on a side face close to one end of the ceramic green molded product serving as each dielectric layer, and a conductor paste obtained by admixing an organic solvent medium and a solvent in powder of W, Mo, Mn, or the like material is applied to the inner surface of the castellation by a suction printing technique. Note that it is essential only that the castellation conductor 5b is formed on one side face close to one end 1a crossing the line direction of the first line conductor 11. Accordingly, FIG. 1 and FIGS. 4 to 6 show an example where the castellation is formed only on one side face. However, the invention is not limited thereto and thus the castellation may be formed on both of the side face close to one end 1a crossing the line direction of the first line conductor 11 and the other side face close to the other end 1c.

In the case of forming the castellation conductor 5b on one side face close to one end 1a, it is advisable for the castellation conductor 5b to be disposed on the side face located externally of a package which will hereinafter be described. In this construction, an external noise signal that finds its way into the package can be shielded by the castellation conductor 5b.

Moreover, as shown in FIGS. 4 to 6, on the side face close to one end 1a crossing the line direction of the first line conductor 11, the castellation conductor 5b is preferably connected to the end portion of the third grounding line conductor 31. By doing so, in a case where a lead 31e is bonded to the third grounding line conductor 31 by means of bracing with use of an Ag—Cu brazing material, an Ag brazing material, or the like, it is possible to form a brazing fillet between the inner surface of the castellation conductor 5b and the lead 31e, with the consequence that the lead 31e can be bonded firmly to the third grounding line conductor 31.

In the case of forming the castellation conductor 5b on each of the two side faces, namely the one close to one end 1a crossing the line direction of the first line conductor 11 and the one close to the other end 1c, it is possible to achieve even better impedance characteristic matching between the first-line conductor 11 and the second line conductor 21.

Moreover, in order to establish electrical connection between the other end 11c of the first line conductor 11 and one end 21b of the second line conductor 21, as well as between one end 31a of the third line conductor 31 and one end 21b of the second line conductor 21, the connecting conductor 40 is provided in the form of a via-hole conductor.

As shown in FIGS. 5(b) and 5(c), the via-hole conductor is formed by forming a through hole at the front end of the third line conductor 31 of the ceramic-green molded product serving as the third dielectric layer 3 or the front end of the second line conductor 21 of the ceramic green molded product serving as the second dielectric layer 2, and by filling the through hole with a conductor paste.

Further, it is advisable that the first grounding line conductor 12, the second grounding line conductor 22, the third grounding line conductor, and the ground layer 5a should be connected to each other by via-hole conductors 5c. As shown in FIGS. 5(b) to 5(e), the via-hole conductor 5c is also formed by forming a through hole at a predetermined location of the ceramic green molded product serving as the corresponding dielectric layer and by filling the through hole with a conductor paste.

As shown in FIGS. 5(b) to 5(e), the via-hole conductors 5c are arranged at a spaced interval shorter than the wavelength λ of the high-frequency signal on the line, for example, at a spaced interval of shorter than or equal to λ/4, in the vicinity of the first line conductor 11, the second line conductor 21, and the third line conductor 31.

Note that the ground layer 5a disposed between the first line conductor 11 and the third line conductor 31 is practically realized by the metallization layer at one end of the second grounding line conductor 22 shown in FIG. 5(c), for example.

The dielectric layers 1 to 4 and n are made of a dielectric material such as alumina ($Al_2O_3$)-based ceramics, aluminum nitride (AlN)-based ceramics, or mullite ($3Al_2O_3 \cdot 2SiO_2$)-based ceramics, and are preferably formed by a ceramic green sheet lamination technique. That is, by employing a ceramic material that exhibits a higher degree of hermeticity reliability than does other dielectric material such as resin and glass, it is possible to improve the hermeticity reliability between inside and outside of the connection terminal 1.

For example, in a case where an $Al_2O_3$-based sintered body is used for the connection terminal 1, suitable agents including an organic binder, a solvent medium, a plasticizer and a dispersant, are admixed in raw material powder of $Al_2O_3$, silicon oxide ($SiO_2$), magnesium oxide (MgO), calcium oxide (CaO), and the like, and the resultant admixture in paste form is processed by a doctor blade method or a calender roll method to form ceramic green, sheets (unsintered ceramic sheets) for constituting the dielectric layers 1 to 4 and n.

In the connection terminal 10, the first line conductor 11, the third line conductor 31, the first grounding line conductor 12, and the third grounding line conductor 32 are each connected with leads (a first lead 11e, a third lead 31e, a first grounding lead 12e, and a third grounding lead 32e), respectively. This makes it possible to establish electrical connection with an external circuit. Also in the lead arrangement, the first lead 11e and the first grounding lead 12e located on both sides thereof, and the third lead 31e and the third grounding lead 32e located on both sides thereof constitute a G-S-G line structure.

While heretofore known electrically conductive materials can be used for the leads 11e, 31e, 12e, and 32e, the use of copper (Cu) having a low resistivity is particularly preferable. More preferably, the lead surface is coated with metal that offer a high corrosion resistance and excellent wettability with respect to a brazing material. For example, a Ni layer having a thickness of 0.5 to 9 μm and a gold (Au) layer having a thickness of 0.5 to 5 μm are successively applied to the surface by a plating technique. This makes it possible to protect the leads 11e, 31e, 12e, and 32e against oxidative corrosion, as well as to achieve firm bonding of the leads 11e, 31e, 12e, and 32e by using a brazing material.

Next, FIG. 7 is a schematic perspective view showing an example of embodiments of a package using the connection terminal 10 in accordance with one embodiment of the invention and an electronic apparatus using the package.

The package in accordance with one embodiment of the invention comprises the aforestated connection terminal 10 and a container body 50 including a base having a cavity, a wall portion of the base being provided with an opening 50a communicating with the cavity. The connection terminal 10 is bonded, at the opening 50a, to the container body 50 so as to allow conduction of electric signals between inside and outside of the cavity.

This construction allows a compact package for effecting conduction of high-frequency electric signals to be attained.

In this construction, the container, body 50 is made of metal such as stainless steel (SUS), copper (Cu), a copper (Cu)-tungsten (W) alloy, a copper (Cu)-molybdenum (Mo) alloy, or an iron (Fe)-nickel (Ni)-cobalt (Co) alloy.

The container body 50 can be formed in one piece of a metal ingot processed into a predetermined shape by a metalworking technique such as metal rolling, press working, or cutting. Alternatively, the container body 50 can be formed by preparing a base plate 51 for constituting the bottom of the container body and a wall portion 52 individually, and bonding the wall portion 52 to an upper surface of the base plate 51 through a brazing material such as a silver (Ag)-Copper (Cu) brazing material. The connection between the wall portion 52 and the base plate 51 is achieved by bonding an upper surface of the base plate 51 to a lower surface of the wall portion 52, through a brazing preform such as a Ag—Cu brazing material which is laid on the upper surface of the base plate 51.

In the wall portion 52, an opening 50a is formed for insertion and attachment of the connection terminal 10 for providing electrical connection between an electronic device 55 and an external electronic circuit.

Moreover, a dielectric material such as ceramics may be used for the container body 50. In the case of forming the container body 50 with use of ceramics, for example, on a ceramic green sheet for constituting the base plate portion 51 of the container body 50 is stacked another ceramic green sheet for constituting the wall portion 52 formed with a through opening serving as the cavity, and the stacked ceramic green sheets are fired. In this way, the container body 50 is fabricated.

Note that, by dividing the green sheet for constituting the wall portion 52 into a plurality of layers, and attaching a conductor paste in accordance with the patterns shown in FIG. 5, to each of the areas of the t layers for the placement of the connection terminal 10, the package can be formed integrally with the connection terminal 10.

Moreover, in a case where the package is designed to accommodate a semiconductor laser (LD), a photodiode (PD), or the like as the electronic device 55, in part of the wall portion 52 is formed an optical signal input-output window serving as an optical transmission path for achieving optical coupling with the electronic device 55.

Further, it is preferable that the container body 50 has its surface coated with metal that offers high corrosion resistance and excellent wettability with respect to a brazing material. Specifically, a Ni layer having a thickness of 0.5 to 9 μm and a gold (Au) layer having a thickness of 0.5 to 5 μm are applied successively to the surface by a plating technique. This makes it possible to protect the container body against oxidative corrosion effectively, as well as to allow the electronic device 15 to adhere firmly to the upper surface of the container body.

Lastly, an electronic apparatus using the aforestated package will be described below.

The electronic apparatus in accordance with one embodiment of the invention comprises the aforestated package, the electronic device 15 mounted within the cavity, and a lid body 20 for sealing the cavity. The package is, in its exterior, connected to an external circuit board by the leads 11e, 31e, 12e, and 32e, and so forth. In the interior of the package, the second line conductor 21 and the second grounding line conductor 22 are connected to the terminal of the electronic component 55 by means of wire bonding or otherwise.

This construction allows a compact electronic apparatus which offers excellent high-frequency transmission characteristics to be attained.

It will thus be seen that the electronic apparatus according to one embodiment of the invention is made compact and is suitable for use in broadband information processing.

It is to be understood that the invention is not limited to the specific embodiments described heretofore, and that many modifications and variations of the invention are possible within a scope of the invention, without departing from the gist thereof.

The invention claimed is:

1. A connection terminal comprising:
 a multilayer body having a first end portion and a second end portion, in which first, second and third dielectric layers are stacked one on top of another;
 a first line conductor which is disposed so as to extend from a central portion of the first dielectric layer to the first end portion and is exposed at the first end portion;
 a first grounding line conductor which is disposed adjacent to both sides of the first line conductor and is exposed at the first end portion,
 two pieces of second line conductors, each of which is disposed so as to extend from a central portion of the second dielectric layer to the second end portion and is exposed at the second end portion;
 a second grounding line conductor which is disposed adjacent to both sides of each of the second line conductors and is exposed at the second end portion;
 a third line conductor which is disposed so as to extend from a central portion of the third dielectric layer to the first end portion and is exposed at the first end portion;
 a third grounding line conductor which is disposed adjacent to both sides of the third line conductor and is exposed at the first end portion; and
 connecting conductors that connects the first line conductor to one of the second line conductors and connects the third line conductor to the other of the second line conductors, respectively, in the central portions.

2. The connection terminal of claim 1, wherein the first end portion is a first end portion of the multilayer body and the second end portion is located at a second end portion of the multilayer body.

3. The connection terminal of claim 1, wherein the second line conductor is narrower in line width than the first or third line conductor.

4. The connection terminal of claim 1, wherein the third grounding line conductor is placed above the first line conductor.

5. The connection terminal of claim 1, wherein the first line conductors or the third line conductors are arranged in parallel to be a differential line structure.

6. The connection terminal of claim 1, wherein a ground layer is formed on the second dielectric layer or the third dielectric layer lying between the first line conductor and the third line conductor.

7. The connection terminal of claim 6, wherein, on a side face of the first end portion, the ground layer is connected to the first grounding line conductor and the third grounding line conductor by a castellation conductor.

8. The connection terminal of claim 6, wherein the ground layer is connected to the first grounding line conductor and the third grounding line conductor by a via-hole conductor.

9. A package comprising a base body having a cavity, and the connection terminal of claim 1 which is attached to a wall portion of the base body and establishes a conducting state between inside and outside of the cavity.

10. An electronic apparatus comprising the package of claim 9, an electronic device mounted within the cavity, and a lid body for sealing the cavity.

* * * * *